United States Patent [19]

Hsia et al.

[11] Patent Number: 5,751,633

[45] Date of Patent: May 12, 1998

[54] METHOD OF SCREENING HOT TEMPERATURE ERASE REJECTS AT ROOM TEMPERATURE

[75] Inventors: Edward Hsia, San Jose; Jose H. Hernandez, Milpitas, both of Calif.; Sayan Suanya, Bangkok, Thailand

[73] Assignee: Advanced Micro Devices, Inc., Sunnyvale, Calif.

[21] Appl. No.: 655,357

[22] Filed: May 24, 1996

[51] Int. Cl.⁶ ................................................ G11C 11/34
[52] U.S. Cl. ........................ 365/185.09; 365/185.19
[58] Field of Search ..................... 365/185.19, 185.22, 365/185.29, 185.3, 185.09

[56] References Cited

U.S. PATENT DOCUMENTS 5,410,511  4/1995  Michiyama ..................... 365/185.22
5,600,595  2/1997  Ogura ............................ 365/185.33
5,608,679  3/1997  Mi .................................. 365/185.22
5,621,687  4/1997  Doller ............................ 365/185.29

Primary Examiner—A. Zarabian
Attorney, Agent, or Firm—H. Donald Nelson

[57] ABSTRACT

In a semiconductor manufacturing process for manufacturing memory devices a method of screening hot temperature erase rejects in memory devices during wafer sort at room temperature that would be rejected at class test at high temperature. Selected cells of the memory device are subjected to a first sequence of erasure pulses at a high voltage until the selected cells are verified erased or until a first maximum number of erasure pulses has been reached, recording the number of pulses required to erase the selected cells, reading and repairing any defective memory cells, and subjecting all cells to a second sequence of erasure pulses until all cells are verified erased or until a maximum number of pulses has been reached wherein the second maximum number is a multiple of the recorded number.

11 Claims, 5 Drawing Sheets

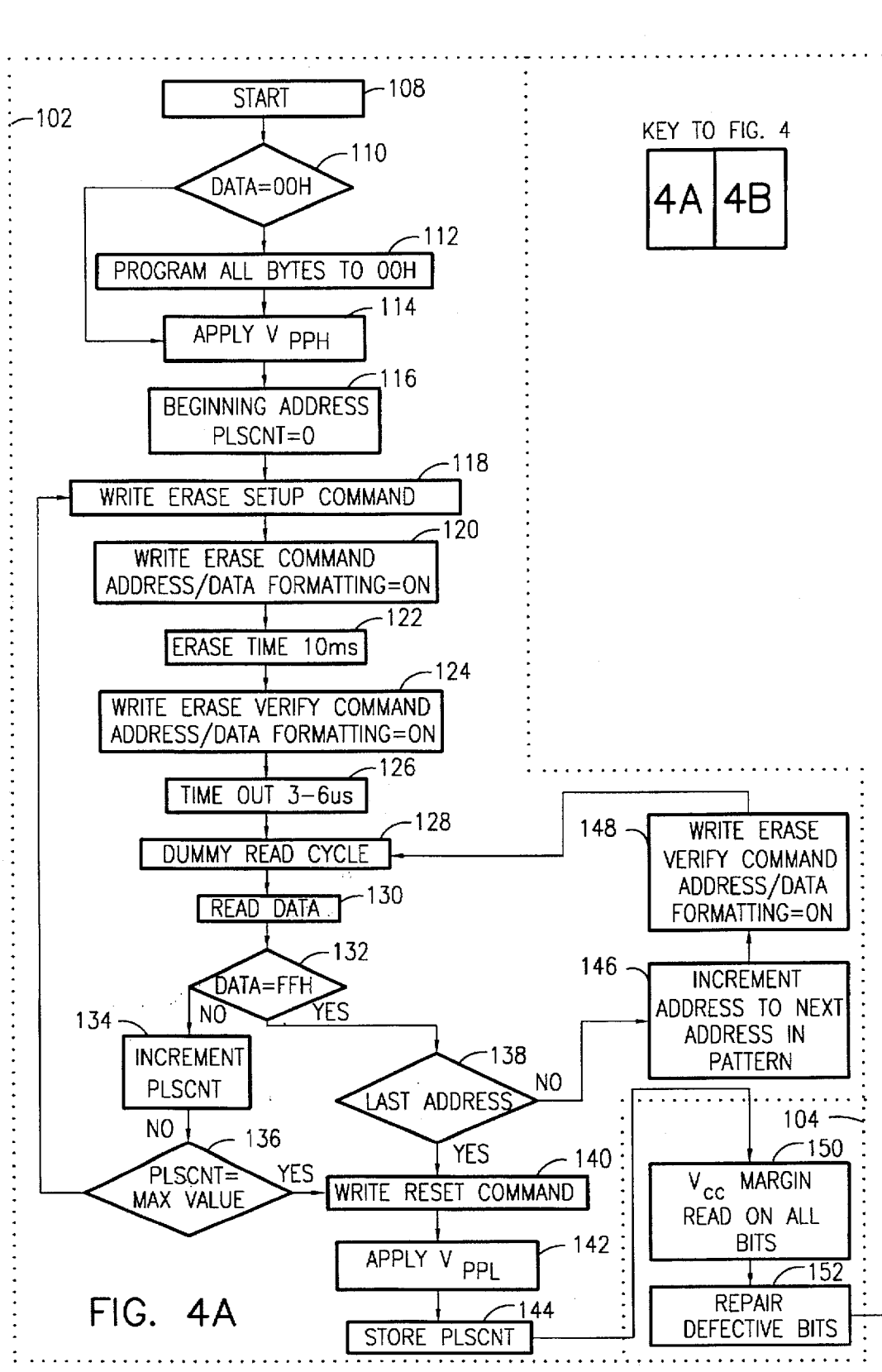

METHOD OF SCREENING HOT TEMPERATURE ERASE REJECTS AT ROOM TEMPERATURE

FIELD OF THE INVENTION

This invention relates generally to the testing of Flash memory devices and, more particularly, to a test method of screening out Flash memory devices during wafer sort conducted at room temperature that would be hot temperature erase rejects discovered during class test conducted at elevated temperature.

DISCUSSION OF THE RELATED ART

This application is related to application, Ser. No. 08/653,211 entitled "Method of Screening Hot Temperature Programming Rejects at Room Temperature" and application, Ser. No. 08/653,227 entitled "Method of Utilizing Redundancy Testing to Substitute for Main Array Programming and AC Speed Reads" both applications having a common assignee with this application and filed on the same date as this application.

The standard test method used for Flash memory devices includes testing at the wafer level and testing after each individual die has been packaged. The wafer level testing is commonly done at room temperature and is called wafer sort. The package level testing is done after the wafer has been sawed into single die and encapsulated in a package which is typically plastic. The package level testing is commonly called final test or class test and is done at an elevated temperature, usually from 70–130 degree Centigrade. Once the package level or class test is complete the Flash memory devices that pass the class test are marked and shipped to the customer.

The wafer sort is used to remove or screen-out the die that have a defect or defects which occur during the fabrication of the Flash wafer. The wafer sort is used to ensure that only those die that have a possibility of being shipped to a customer are encapsulated in a package. This is done to control the package cost since bad die are not packaged.

Presently, the class testing is still necessary since the wafer sort is done at room temperature and some die are sensitive to operations at elevated temperatures and there were no known tests that could be conducted during wafer sort which is conducted at room temperature that could screen erase rejects that would be discovered at elevated temperature testing. The operations that are most sensitive to elevated temperatures are speed sorting (a sort that determines the speed of the Flash memory device), programming, and certain low level leakage current testing. In addition, a part of class testing is to ensure that the encapsulation process did not damage the die.

A programming operation changes the logic state of a cell from a "1" (called "blank") to a logic "0" (called "programmed"). The programming and read operations are done at the byte level, that is, 8 cells (bits) at a time, on the Flash memory devices. The erase operation changes the logic of the cell to a "1" or blank state. The erase operation is done on all cells in the array at the same time. To prevent "over-erasure" of an individual cell, all cells must be programmed to a logic "0" before the erase operation. Over-erasure of a cell can cause problems during subsequent programming and read operations and in some cases would prevent the cell from being programmed. The Flash memory device must have all cells at a logic "1" when transferred to the class testing or when shipped to a customer. This means that if any cell is read as programmed, that is, read at a logic "0" then all cells must be programmed to a logic "0", read, erased, and reread to ensure all cells are blank, that is, are at a logic "1". Presently, this must be done at both wafer sort and class test.

One of the problems encountered is that the cells are not exactly the same, that is, some cells either program or erase faster or slower than others. It is necessary, therefore, to provide a series of programming pulses or erase pulses to a device. The key to a good device is that all cells in the device can be programmed or erased by being subjected to a series of program pulses or erase pulses with the number of pulses being within an acceptable range. This is a more critical range during erase operations, since if one cell erases very rapidly and is subjected to further erase pulses while the slower cells are being erased the rapidly erased cell may become over-erased. Over-erased cells can cause a malfunction in a subsequent programming operation.

The wafer sort and class test require lengthy test sequences due to the large number of memory cells that need to be read, programmed, read again, erased, and read again. The number of cells in a Flash memory device is commonly on the order of 1–2 million cells. It is expected that this number will increase in the future.

What is needed is a test methodology that can be conducted at room temperature during wafer sort that can successfully screen out those Flash memory devices that would be rejected during elevated temperature erase testing during class test, thus negating the requirement to repeat the lengthy testing sequence during class test. The advantages of such a test methodology would be that (1) test time for each good Flash memory device would decrease leading to lower product cost, (2) class test yields would increase since elevated temperature erase rejects would not be packaged and subjected to class testing which would result (3) in lower overall packaging cost.

SUMMARY OF THE INVENTION

In accordance with the present invention a method is provided for screening hot temperature erase rejects at room temperature in a semiconductor memory manufacturing process. A number of cells are selected for an initial test during wafer sort. All cells are subjected to a first sequence of erasure pulses at a high voltage until the selected cells are verified erased or a designated maximum number of erasure pulses has been reached. The number of erasure pulses required is recorded, including the maximum number.

All cells are subjected to a margin read and any defective cells are repaired. All cells are then subjected to a second sequence of erasure pulses at a second voltage. The maximum number of erasure pulses during the second sequence number is determined from the recorded number of erasure pulses in the first sequence of erasure pulses. The maximum number of the second sequence of erasure pulses is determined by multiplying the recorded number by a multiplier.

The multiplier is typically between 150 to 300% of the recorded number.

The second voltage during erase is lower than the first voltage. The first voltage for a 12 volt memory device is in the range of 12.5 to 13.5 volts and the second voltage is in the range of 10.75 to 11.5 volts. These voltages would be appropriately scaled for 3 volt and 5 volt memory devices and for other voltage memory devices.

The present invention is better understood upon consideration of the detailed description below, in conjunction with the accompanying drawings. As will become readily apparent to those skilled in this art from the following description there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The accompanying drawings incorporated in and forming a part of the specification, illustrate the present invention, and together with the detailed description below serve to explain the principles of the invention. In the drawings.

DETAILED DESCRIPTION

Figure 1:
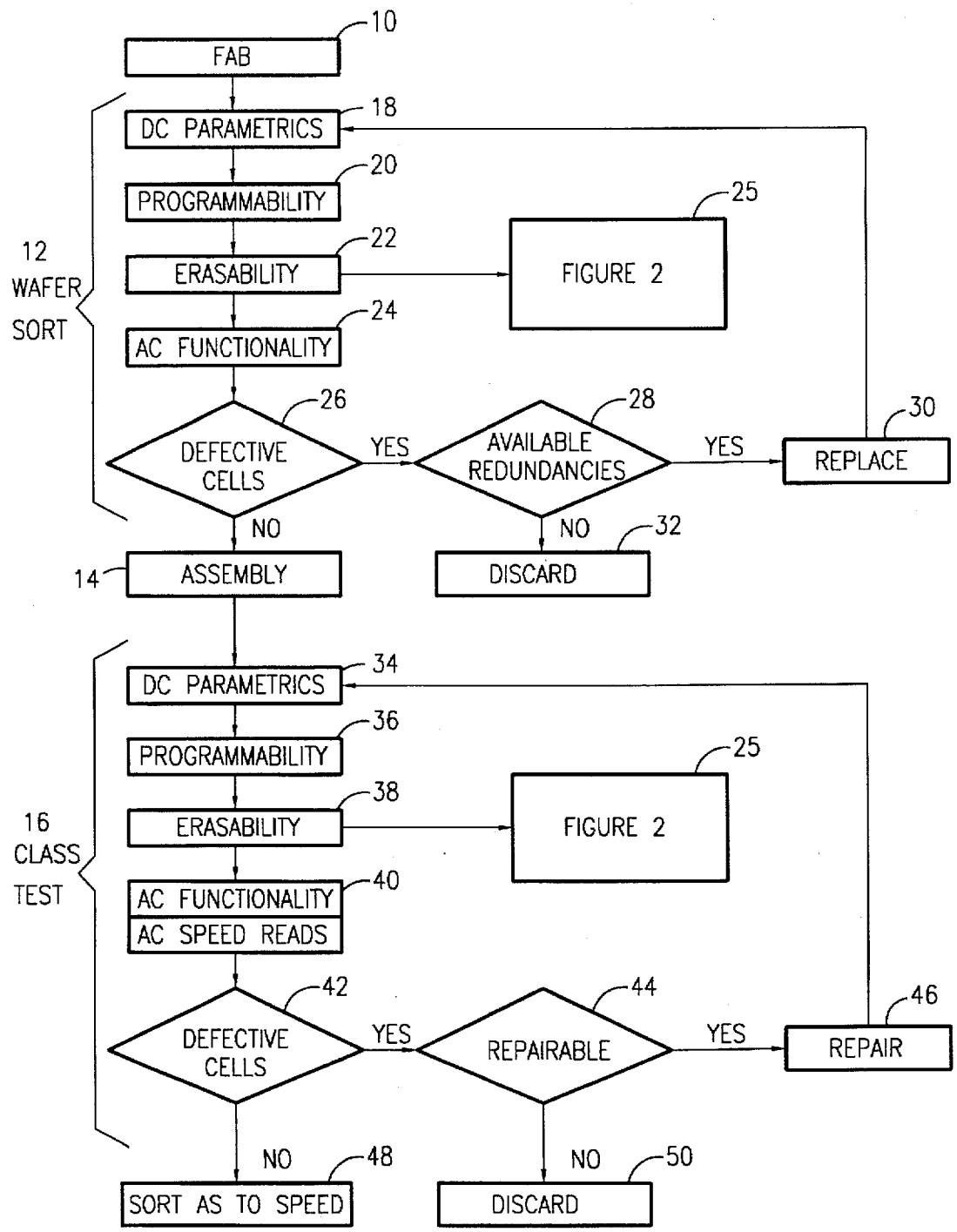
FIG. 1 shows the prior art testing method for Flash memory devices.

Referring now to FIG. 1 there is shown the prior art method of testing Flash memory devices. The manufacture of Flash memory devices can be informally divided into four overall processes. The first process is represented in FIG. 1 as fab 10 which represents the actual fabrication of the Flash memory device in wafer form. The next major process is referred to as wafer sort 12 which will be discussed below. The third major process is referred to as the assembly process 14 and represents the process in which the wafer is sawed into individual die and each non-defective die, as determined in wafer sort 12, is packaged. The fourth major process is referred to as class test 16 and will be discussed below.

Figure 2:
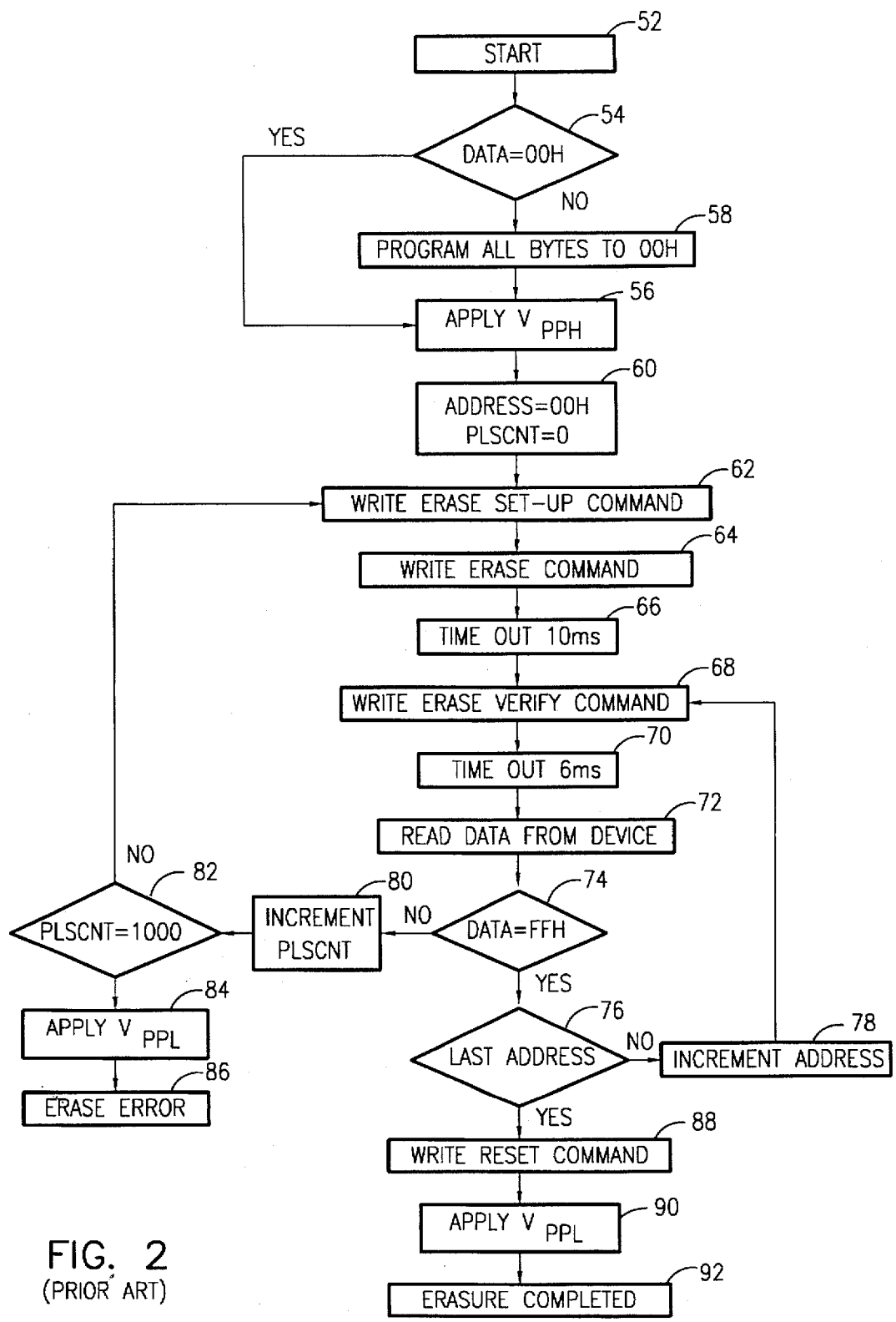
FIG. 2 shows the prior art method for testing for erasure failures.

The major tests performed in wafer sort 12 are the tests referred to as dc parametrics 18 for each cell which include testing for dc continuity, shorts, leakage current tests, etc., the programmability 20 of each cell, the erasability 22 of each cell, and the ac functionality 24 of each cell. The erasability algorithm utilized in erasability 22 testing in wafer sort 12 is shown in FIG. 2 as represented by box 25 and will be discussed below.

It has become the standard practice to manufacture Flash memory devices with a main array section and a redundancy array section. The redundancy array section is a section comprising cells that are identical to the cells in the main array section and are used to replace defective cells identified in the main array during wafer sort. For example, the Advanced Micro Devices part Am28F020 is a 2 Megabit Flash memory device organized as 256 KBytes of 8 bits each. The 256 KBytes consist of an array of 1024 rows by 256 columns of bytes. The redundancy cells are also manufactured in columns 8 bits wide and the same length as the main array columns. The number of redundancy columns included in the die depends upon the number of defective cells the manufacturer, through experience and statistical analysis conducted for each manufacturing process predicts will be needed to replace defective die during wafer sort. As can be appreciated, the more redundancy cells that are available will increase product yield, however, there is a point of diminishing returns because the die would have to be larger, and thus more costly to manufacture, to accommodate a larger number of redundancy cells.

If there is determined at 26 that the dc parametrics test 18, the programmability test 20, the erasability test 22, or the ac functionality test 24 has identified a defective cell it is then determined at 28 whether there is an available redundancy with which the defective cell can be replaced. If there is an available redundancy the defect is corrected by replacing the column containing the defective cell at 30. The correction is done by disconnecting the defective column through repair circuitry and connecting the redundancy column with the repair circuitry. If there isn't an available redundancy to replace the defective cell the device is marked for discard at 32. The die that pass the wafer sort 12 are passed to assembly 14 where the wafer is sawed into individual die and the die that passed are packaged. After packaging the die are then passed to class test 16 where the packaged die are again subjected to dc parametrics testing 34, programmability testing 36, erasability testing 38, and ac functionality testing and ac speed reads 40. The erasability testing 38 algorithm is shown in FIG. 2 as indicated at 25. The above tests are basically the same, however, the tests performed at class test 16 are typically done at an elevated temperature.

If there is determined at 42 that the dc parametrics test 34, the programmability test 36, the erasability test 38 or the ac functionality tests and ac speed reads 40 has identified a defective cell it is then determined at 44 whether the defective cell is repairable. If the defective cell is repairable it is repaired at 46 and the necessary tests from class test 16 are repeated to ensure that the device has been properly repaired and is good.

If it is determined at 42 that the device is good the device is sorted as to speed as indicated at 48. If it is determined at 44 that the defective cell is not repairable the device is marked for discard as indicated at 50.

Referring now to FIG. 2 there is shown the erase algorithm as used in the prior art and as used in both wafer sort 12 (FIG. 1) and class sort 16 (FIG. 1) in the prior art testing procedure. The erase algorithm shown in FIG. 2 is the Flasherase™ erase algorithm belonging to Advanced Micro Devices, Inc. As can be appreciated, any erase algorithm could be used in the prior art. The following description will apply to both the wafer sort 12 and the class test 16 with the exception that the tests during wafer sort are done on individual die while still in wafer form and in class test the tests are done on individual die after being packaged. In addition, the tests done during wafer sort are done at room temperature and the tests done during class test are done at an elevated temperature.

The test procedure is started at 52 and each byte of the memory device is read to see if it reads 00H as indicated at 54. If it is determined that all bytes read 00H the process jumps to the step of applying $V_{PPH}$ at 56. However, if any byte does not read 00H it is necessary to program all bytes to read 00H as indicated at 58. Any programming algorithm could be used to program all the bytes to 00H. For example, the Advanced Micro Devices, Inc. Flashrite™ programming algorithm is an algorithm that could be used to program the device in step 58. This is necessary to ensure that no cell is over-erased which could cause malfunctioning of the device during a subsequent programming sequence.

After each byte is verified to read 00H and $V_{PPH}$ has been applied, the address is set to 00H and the pulse count (PLSCNT) is set to 0 at 60. Step 62 is the write erase set-up command, step 64 is the write erase command where the command to erase is given, step 66 is a time out for 10 milliseconds, step 68 is the write erase verify command which is set to verify that all bytes have been erased. As indicated below the verify (read) is done a byte at a time and has to be repeated until each byte is verified to read FFH. Step 70 is a time out of 6 microseconds and step 72 is a read data from the current byte step. If it is determined at step 74 that the current byte reads FFH step 76 determines if the byte just read is at the last address. If the last byte read is not at the last address, the address is incremented at 78 and the process jumps back to step 68 where the process will verify the byte at the new address. If, at step 74, it is determined that the byte being verified does not read FFH, the pulsecount is incremented at 80 and if the maximum allowed pulsecount has not been reached at 82 the process jumps back to step 62 and the erase sequence is repeated for the byte that has not read as erased. If, at step 82, it is determined that the maximum pulsecount has been reached $V_{PPL}$ is applied at 84 and an erase error is noted as indicated at 86. If this erase algorithm is being run during wafer sort 12 (FIG. 1) the defective cell would be detected at 26 (FIG. 1). If this erase algorithm is being run during class test 16 (FIG. 1) the defective cell would be detected at 42 (FIG. 1).

If, at step 76, it is determined that the byte being verified is at the last address the process goes to step 88 and the write reset command is issued, $V_{PPL}$ is applied at 90 and an erasure completed indication is noted at 92. If this erase algorithm is being run during wafer sort 12 (FIG. 1) the device would be determined, at 26 (FIG. 1), to have passed the erasability test. If this erase algorithm is being run during class test 16 (FIG. 1) the device would be determined, at 42 (FIG. 1), to have passed the erasability test.

Figure 3:
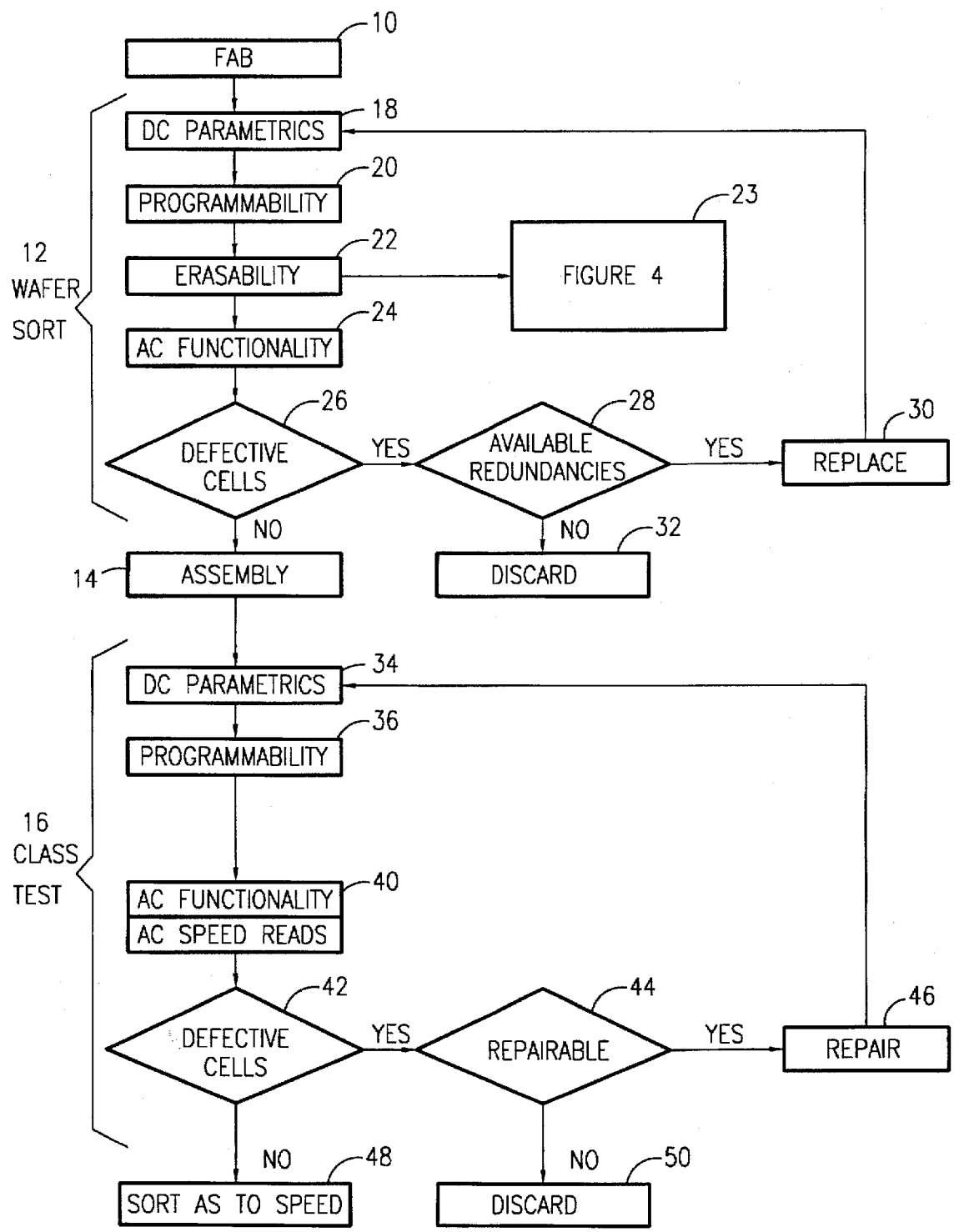
FIG. 3 shows the testing methodology of the present invention.

Referring now to FIG. 3 there is shown the overall flow diagram for Flash memory manufacturing and testing of the present invention. FIG. 3 is analogous to FIG. 1 and like steps are referenced with like numerals between FIGS. 1 and 3. As described above in the discussion of the process shown in FIG. 1, the manufacture of Flash memory devices can be informally divided into four overall processes. The first process is represented in FIG. 3 as fab 10 which represents the actual fabrication of the Flash memory device in wafer form. The next major process is referred to as wafer sort 12 which will be discussed below. The third major process is referred to as the assembly process 14 and represents the process in which the wafer is sawed into individual die and each non-defective die, as determined in wafer sort 12, is packaged. The fourth major process is referred to as class test 16 and will be discussed below.

The major tests performed in wafer sort 12 are the tests referred to as dc parametrics 18 for each die which include testing for dc continuity, shorts, leakage current tests, etc., the programmability 20 of each cell, the erasability 22 of each cell, and the ac functionality 24 of each cell. The erasability algorithm utilized in erasability 22 testing in wafer sort 12 is shown in FIG. 4 as represented by box 23 and will be discussed below.

If there is determined at 26 that the programmability test 20, the erasability test 22, or the ac functionality test 24 has identified a defective cell it is then determined at 28 whether there is an available redundancy with which the defective cell can be replaced. If there is an available redundancy the defect is corrected by replacing the column containing the defective cell at 30. The correction is done by disconnecting the column containing the defective cell through repair circuitry and connecting the redundancy column with the repair circuitry. If there isn't an available redundancy to replace the defective cell the device is marked for discard at 32. The die that pass the wafer sort 12 are passed to assembly 14 where the wafer is sawed into individual die and the die that passed are packaged.

The prior art method as shown in FIGS. 1 and 2 require that packaged die have to be subjected to the same tests during class test 16 as performed in wafer sort 12 (FIG. 1). Referring now to FIG. 4 there is shown a new method of testing for the erasability of die still in wafer form and at room temperature that accurately screens die that would fail under elevated temperature testing such as that done in the prior art class test.

Figure 4B:
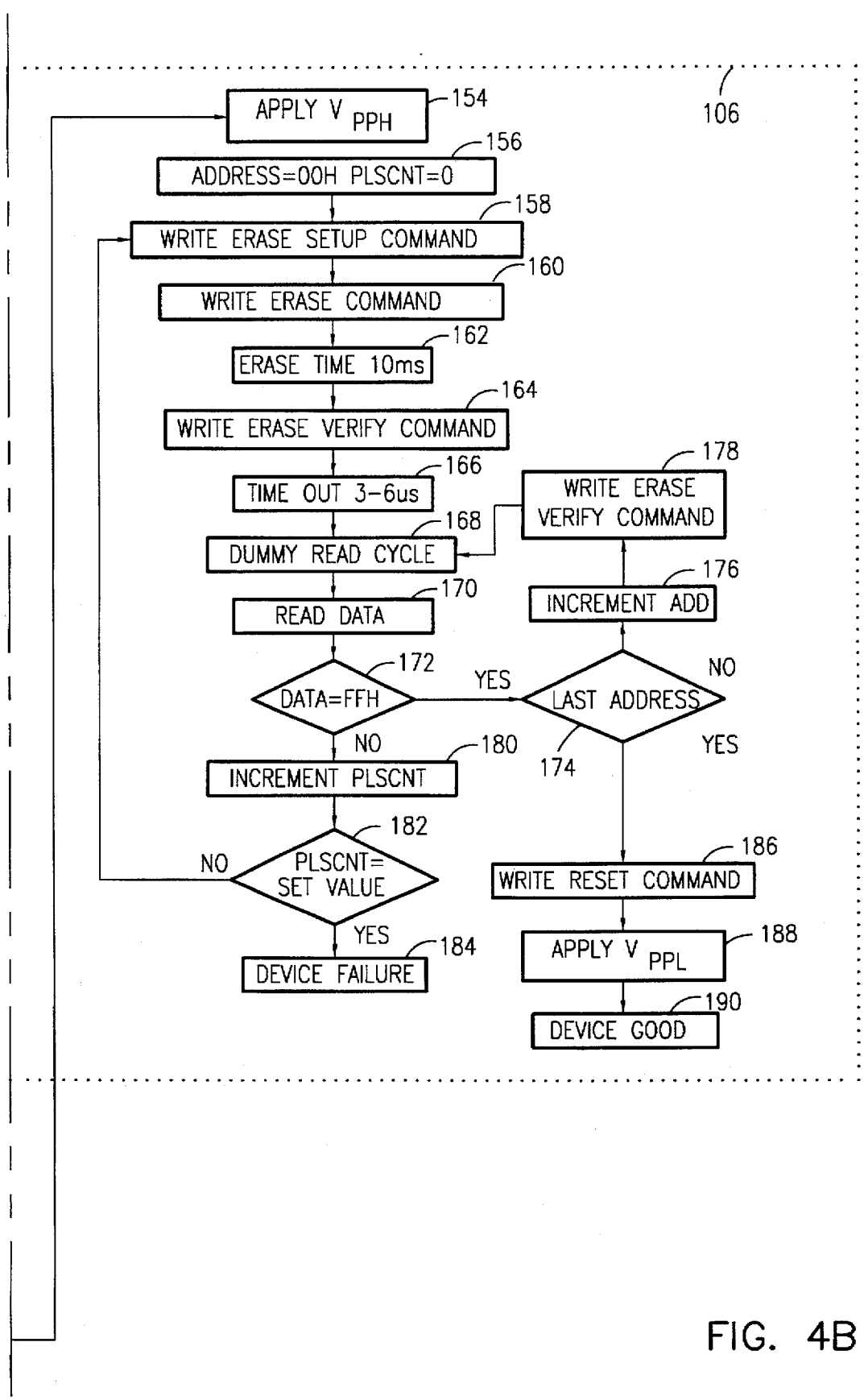
FIG. 4 shows the present invention methodology for testing for erasure failures.

The new method of erasability testing shown in FIG. 4 is done in 3 basic procedures. The first procedure is shown within dotted line 102. During the first procedure only selected cells within the Flash memory device are tested for erasability at a $V_{PPH}$ voltage of 12.5–13.5 volts. The voltage range of 12.5–13.5 volts is for a 12 volt memory device. This voltage range would be scaled for other voltage memory devices. For example, a 3 volt or a 5 volt memory device would have appropriately scaled voltages. The only basic selection criterium is that each row and each column will have one cell selected for test. The output of the first procedure is a record of the pulsecount at which all the selected cells are shown as erased. The number of pulses is limited to a maximum number and is on the order of 400 to 500 erase pulses. If the selected cells do not show as erased within the maximum number of pulses the maximum number is recorded. During the first procedure the address/data formatting is on and the write parameters are checked/tested. The second procedure is shown within dotted line 104 and performs a normal $V_{CC}$ Margin read on all cells in the array to determine if any cell has not been successfully erased and repairs any identified defective cells. During a Margin $V_{CC}$ read an externally applied margin voltage is applied to the addressed byte. Reading FFH from the addressed byte indicates that all bits in the byte are properly erased. As can be appreciated, when the test is being done at wafer sort, the margin voltage is applied by the test equipment.

The third procedure is shown within dotted line 106 and an erase procedure is performed on all the cells in the Flash memory array. In the third procedure the voltage $V_{PPH}$ is in the range of 10.75 to 11.5 volts. As discussed above this range of voltages is for a 12 volt memory device. This range of voltages would be scaled appropriately for a 3 volt or a 5 volt memory device. In addition, the number of pulses is limited to a multiple of the pulsecounts recorded in the first procedure. The multiple is dependent upon the particular process, for example, a 0.35 micron process may have a different set number of pulsecounts than a 0.65 micron process and different manufacturing facilities may have different set number of pulsecounts. The exact multiple is determined by trial and error and a statistical analysis of trial runs for each process. The multiple is typically within the range of 150–300% of the number measured during the first procedure. In some cases, the multiple can range from 50% to 150% of the number of pulses recorded in the first procedure. When the correct multiple is determined it has been found that the procedure of the present invention predicts exactly the hot erase rejections that would have been identified if the hot temperature erasability test had been conducted during class test. During the third procedure if the pulsecount exceeds the number of pulsecounts as determined by the number recorded in the first procedure the device is considered to have failed and the die is marked as an erase failure. If the device reads as all cells erased within the set number of pulsecounts the device is considered to have passed and is passed to the assembly process.

The first procedure starts at step 108 and the steps at 110, 112, and 114 are needed to ensure that all bytes are programmed to read 00H. The bytes are read at 110 and if all bytes are at 00H the process applies $V_{PPH}$ at 114. The $V_{PPH}$ applied is a high voltage and is in the range of 12.5 to 13.5 volts. If any byte does not read 00H at 110 the device is programmed at 114. Any programming algorithm could be used, however, a programming algorithm that could be used, for example, is the Flashrite™ programming algorithm owned by Advanced Micro Devices, Inc. The beginning address of the first selected cell to be tested is programmed into the process at 116 along with an initial pulsecount of zero. The write erase setup command is at 118, the write erase command with address/data formatting=on is at 120. The address/data formatting=on provides that the write parameters are to be checked/tested. A time out of 10 ms is at 122. The write erase verify command with address/data formatting=on is at 124 followed by a time out of 3–6 microseconds at 126. The write erase verify command=on provides that the write parameters are checked one address at a time. A dummy read cycle is inserted at 128 followed by a read data step at 130. The dummy read cycle is inserted to save time since the dummy read cycle is shorter than the 3–6 microseconds of the previous step at 126 and the consecutive erase verifies do not require the full 3–6 microseconds delay time. The dummy cycle is typically on the order of 100 nanoseconds to 1 microsecond. If the byte read at 130 does not read FFH at 132 the pulsecount is incremented at 134 and if at 136 the pulsecount does not exceed a predetermined maximum value which is typically between 400 and 500 the process jumps to step 118, the write erase setup command. If the pulsecount exceeds the predetermined maximum value at 136 the next step is the write reset command at 140 after which $V_{PPL}$ is applied at 142 and the maximum value pulsecount value is recorded at 144. If the data read at step 132 reads FFH it is determined at 138 whether the byte read is at the last address of the selected cells to be read. If the last address is reached as determined at 138 the process jumps to the write reset command at 140, $V_{PPL}$ is applied at 142, and the pulsecount is stored at 144. If the last address has not been reached as indicated at 138 the address is incremented to the next address in the selected group of cells at 146 and the write erase verify command with address/data formatting=on is set at 148 and the process jumps to the dummy read cycle 128.

When the process reaches the store pulsecount step at 144 the process begins the second procedure at 104. The first step 150 of the second procedure is a $V_{CC}$ margin read on all bits and defective bits are repaired at 152. When all defective bits are repaired at 152 the third procedure begins.

The third procedure which is within dotted line 106 begins by applying $V_{PPH}$ at 154. The beginning address and the beginning pulsecount is set at 156. The erase setup command at 158 and the write erase command at 160 initiate the erase sequence. The erase time is set at 162 and the write erase verify command is at 164. A time out of 3–6 microseconds is at 166 leading into dummy read cycle at 168. The dummy read cycle is used on the subsequent steps in which the address is incremented to save time by bypassing the time out of 3–6 microseconds in step 166. Time is saved because the dummy read step is much shorter than 3–6 microseconds. Consecutive erase verifies do not require the full 3–6 microsecond delay time. The dummy read cycle is typically in the range of 100 nanoseconds to 1 microsecond. The data from the byte being tested is read at 170. If the data reads FFH as determined at 172 it is determined at 174 if the byte just tested was at the last address of the device. If it is not, address is incremented at 176, the write erase verify command is reset at 178 and the next address is read starting at the dummy read cycle at 168. If 172 it is determined that the data does not read FFH, the same byte is retested by incrementing the pulsecount at 180 and if it is determined at 182 that the pulsecount has not reached the set value determined from the data from the first procedure the process jumps to the write erase setup command at 158 and the erase sequence is repeated for the same byte. If at 182 it is determined that the pulsecount has reached the set value the die is marked as a device failure at 184. If at 174 it is determined that the byte just tested is at the last address in the device the write reset command is set at 186, $V_{PPL}$ is applied at 188 and the device is marked as good at 190.

Referring now to FIG. 3 the die that are marked as being good at step 190 (FIG. 4) would be passed to ac functionality test 24, then to assembly step 14. After being sawed into individual die and packaged the die are passed to class test 16. The tests that are conducted during class test are programmability 36 and the ac functionality tests 40 which include ac speed reads. If there is determined at 42 that the dc parametrics test 34, the programmability test 36 or the ac functionality tests and ac speed reads 40 has identified a defective cell it is then determined at 44 whether the defective cell is repairable. If the defective cell is repairable it is repaired at 46 and the necessary tests from class test 16 are repeated to ensure that the device has been properly repaired and is good. Because the erasability tests do not have to be rerun there is a savings in time during class test 16. Although the erasability tests do not have to be run, it is noted that Flash memory devices must be erased when shipped to a customer.

The foregoing description of the preferred embodiment of the present invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What we claim is:

1. A method of testing Flash memory devices for erasability at room temperature during wafer sort to screen out those Flash memory devices that would be rejected during elevated temperature testing for erasability during class test thus negating the requirement to test the Flash memory devices for erasability during class test, wherein the Flash memory devices are organized in x number of rows and y number of columns, the method comprising:

selecting a number of memory cells in a Flash memory device including at least one memory cell from each of the x number of rows and at least one memory cell from the y number of columns;

subjecting the selected number of memory cells to a first sequence of erasure pulses at a first voltage until the selected memory cells are verified erased or until a first maximum number of erasure pulses has been reached;

recording a number of erasure pulses at which the selected memory cells are verified erased if the selected memory cells are verified erased before the first maximum number of erasure pulses has been reached;

subjecting all cells to a margin read to determine if any cell has not been successfully erased;

repairing all cells determined to have not been successfully erased;

subjecting all cells to a second sequence of erasure pulses at a second voltage until all the memory cells are verified erased or until a second maximum number of erasure pulses has been reached;

marking the Flash memory device as passed if all memory cells are verified erased before the second maximum number of erasure pulses has been reached; and marking the Flash memory device as failed if all memory cells are not verified erased before the second maximum number of erasure pulses has been reached.

2. The method of claim 1, wherein said second maximum number is determined by multiplying said recorded number or said first maximum number by a multiplier.

3. The method of claim 2, wherein said multiplier is in the range of 150 to 300% of said recorded number.

4. The method of claim 3, wherein said first maximum number of pulses is in a range of 400–500.

5. The method of claim 4, further comprising the step of reading each memory cell location and repairing any defective cell detected.

6. The method of claim 5, wherein the first voltage is higher than the second voltage.

7. The method of claim 6, wherein the first voltage is between 12.5 and 13.5 volts.

8. The method of claim 7, wherein the second voltage is between 10.75 and 11.5 volts.

9. The method of claim 1, wherein the step of subjecting all memory cells with a first sequence of erasure pulses at a first voltage until the selected memory cells are verified erased or until a first maximum number of erasure pulses has been reached includes a first short duration dummy read cycle.

10. The method of claim 9, wherein the step of subjecting all memory cells with a second sequence of erasure pulses at a second voltage until all memory cells are verified erased or until a second maximum number of erasure pulses has been reached includes a second short duration dummy read cycle.

11. The method of claim 10, wherein the first and second short duration dummy read cycle have a duration in the range of 100 nanoseconds to 1 microsecond.

* * * * *